United States Patent
Al-Assadi et al.

(10) Patent No.: US 7,332,938 B2
(45) Date of Patent: Feb. 19, 2008

(54) DOMINO LOGIC TESTING SYSTEMS AND METHODS

(75) Inventors: Waleed K. Al-Assadi, Rolla, MO (US); Pavankumar Chandrasekhar, Rancho Cordova, CA (US)

(73) Assignee: The Curators of the University of Missouri, Rolla, MO (US)

( * ) Notice: Subject to any disclaimer, the term of this patent is extended or adjusted under 35 U.S.C. 154(b) by 55 days.

(21) Appl. No.: 11/426,278

(22) Filed: Jun. 23, 2006

(65) Prior Publication Data

US 2007/0296465 A1 Dec. 27, 2007

(51) Int. Cl.
*H03K 19/096* (2006.01)
(52) U.S. Cl. .......................... 326/121; 326/93
(58) Field of Classification Search ............ 326/93–98, 326/112, 119, 121
See application file for complete search history.

(56) References Cited

U.S. PATENT DOCUMENTS

| | | | | | |
|---|---|---|---|---|---|
| 5,467,026 | A | * | 11/1995 | Arnold | 326/16 |
| 5,748,012 | A | * | 5/1998 | Beakes et al. | 326/93 |
| 5,831,990 | A | * | 11/1998 | Queen et al. | 714/724 |
| 5,896,399 | A | * | 4/1999 | Lattimore et al. | 714/721 |
| 6,636,996 | B2 | | 10/2003 | Nowka | |
| 6,765,414 | B2 | * | 7/2004 | Keshavarzi et al. | 326/93 |
| 2004/0145384 | A1 | * | 7/2004 | Bernstein et al. | 324/765 |

OTHER PUBLICATIONS

Walker, A. et al., An Approach for Detecting Bridging Faults in CMOS Domino Logic Circuits using Dynamic Power Supply Current Monitoring, Department of Electrical Engineering, North Carolina A&T State University, 1997, pp. 272-280, no month.

Chang, J. et al., Detecting Bridging Faults in Dynamic CMOS Circuits, Center for Reliable Computing, Stanford University, Date Unkown (3 pages), no date.

Renovell, M. et al. Current Testing Viability in Dynamic CMOS Circuits, Universite de Montpellier II (France), 1993, pp. 207-214, no month.

Waleed, K. et al., Faulty Behavior of Storage Elements and Its Effect on Sequential Circuits, IEEE Transactions on Very Large Scale Integration (VLSI) Systems, vol. 1, No. 4, Dec. 1993, pp. 446-452.

Adams, R., et al., The Limits of Digital Testing for Dynamic Circuits, Design for Testability, IBM, Endicott, NY, Date Unknown (5 pages), 1999, no month.

* cited by examiner

*Primary Examiner*—Don Le
(74) *Attorney, Agent, or Firm*—Ari M. Bai; Polsinelli Shalton Flanigan Suelthaus PC (57) ABSTRACT

A domino logic test circuit includes a dynamic node, a precharge device for charging the dynamic node, and an output inverter for inverting an output of the dynamic node. A logic network is coupled to the dynamic node for discharging the dynamic node in accordance with logic. A footer device enables and disables the logic network. A keeper device is coupled to the dynamic node for retaining a charge state of the dynamic node while awaiting the logic network to operate in accordance with the logic. A test mode selection device is coupled to the dynamic node and is configured to enable a latch in the test mode. A phase selection device is configured to receive at least a wait signal and to enable selection of at least a precharge phase for charging the dynamic node to a voltage level, a write phase for generating a value to the latch based on the logic and the voltage level of the dynamic node, and a wait phase for enabling reading the value. The selection is based, at least partially, on the wait signal state.

54 Claims, 7 Drawing Sheets

|  |  |  | Input Vector | | | sum_fault/carry_fault output at end of wait phase | |
|---|---|---|---|---|---|---|---|
|  |  |  | Cin | A3 - A0 | B3 - B0 | Expected | Observed |
| Full Adder Stage 1 | Sum | keeper open | 0 | 0000 | 0000 | 0 | 1 |
|  |  | keeper on | 0 | 0001 | 0000 | 1 | 0 |
|  |  | footer on | 0 | 0001 | 0000 | 0 | 1 |
|  | Carry | keeper open | 0 | 0000 | 0000 | 0 | 1 |
|  |  | keeper on | 0 | 0001 | 0001 | 1 | 0 |
|  |  | footer on | 0 | 0001 | 0001 | 0 | 1 |
| Full Adder Stage 2 | Sum | keeper open | 0 | 0000 | 0000 | 0 | 1 |
|  |  | keeper on | 0 | 0010 | 0000 | 1 | 0 |
|  |  | footer on | 0 | 0001 | 0001 | 0 | 1 |
|  | Carry | keeper open | 0 | 0000 | 0000 | 0 | 1 |
|  |  | keeper on | 0 | 0010 | 0010 | 1 | 0 |
|  |  | footer on | 0 | 0010 | 0010 | 0 | 1 |
| Full Adder Stage 3 | Sum | keeper open | 0 | 0000 | 0000 | 0 | 1 |
|  |  | keeper on | 0 | 0100 | 0000 | 1 | 0 |
|  |  | footer on | 0 | 0010 | 0010 | 0 | 1 |
|  | Carry | keeper open | 0 | 0000 | 0000 | 0 | 1 |
|  |  | keeper on | 0 | 0100 | 0100 | 1 | 0 |
|  |  | footer on | 0 | 0100 | 0100 | 0 | 1 |
| Full Adder Stage 4 | Sum | keeper open | 0 | 0000 | 0000 | 0 | 1 |
|  |  | keeper on | 0 | 1000 | 0000 | 1 | 0 |
|  |  | footer on | 0 | 0100 | 0100 | 0 | 1 |
|  | Carry | keeper open | 0 | 0000 | 0000 | 0 | 1 |
|  |  | keeper on | 0 | 1000 | 1000 | 1 | 0 |
|  |  | footer on | 0 | 1000 | 1000 | 0 | 1 |

FIGURE 14

DOMINO LOGIC TESTING SYSTEMS AND METHODS

RELATED APPLICATIONS

Not Applicable

FEDERALLY SPONSORED RESEARCH OR DEVELOPMENT

Not Applicable

COMPACT DISK APPENDIX

Not Applicable

BACKGROUND OF THE INVENTION

Dynamic logic circuits have become prevalent in high performance integrated circuits because they offer faster switching speeds and a smaller area than static logic circuits. Dynamic logic circuits generally use complementary metal oxide semiconductor (CMOS) devices.

Figure 1:
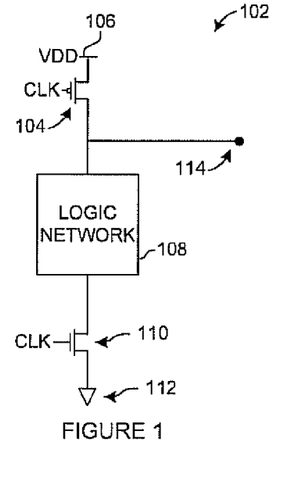
FIG. 1 is a circuit diagram of a dynamic logic circuit.

As depicted in FIG. 1, a dynamic logic circuit 102 includes a p-type channel MOS (PMOS) precharge transistor 104 coupled to a voltage source 106 having a voltage level ($V_{dd}$), an n-type channel MOS (NMOS) logic network 108, and an NMOS footer transistor 110 coupled to ground 112. The output is measured at a dynamic node 114. The circuit operation is controlled by a clock signal (CLK) that is applied to both the PMOS precharge transistor 104 and the NMOS footer transistor 110.

The dynamic logic circuit 102 has two phases of operation. When the clock signal is at a logic zero, the dynamic logic circuit 102 is in a precharge phase, and the dynamic node 114 is charged to $V_{dd}$. When the clock signal is at a logic one, the dynamic logic circuit 102 is in the evaluation phase, and the voltage at the dynamic node 114 depends on the inputs and the Boolean function represented by the NMOS logic network 108. If the conditions are such that the NMOS logic network 108 conducts, the dynamic node 114 discharges. However, if the NMOS logic network 108 does not conduct, the dynamic node 114 becomes a floating node and remains at $V_{dd}$.

Unfortunately, the transistor gates of dynamic logic circuits cannot be directly cascaded. Dynamic logic circuits also have problems with charge leakage and charge sharing.

Figure 2:
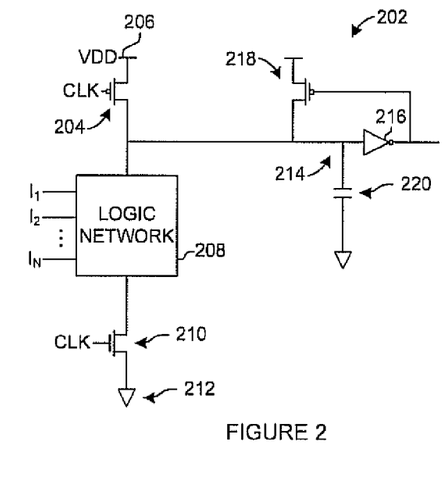
FIG. 2 is a circuit diagram of a domino logic circuit.

Referring to FIG. 2, a domino logic circuit 202 is a type of dynamic logic that employs a dynamic part with a precharge transistor 204 coupled to a voltage source 206 having a voltage level ($V_{dd}$), an NMOS logic network 208, an NMOS footer transistor 210 coupled to ground 212, and a dynamic node 214. The dynamic part is followed by a static inverter 216. The inverter 216 enables the gates of the transistors to be directly cascaded in the domino logic circuit 202.

The domino logic circuit 202 includes a keeper transistor 218 to overcome the problems of charge leakage, charge sharing, and floating nodes. The keeper transistor 218 generally is a weak PMOS transistor used to retain the precharge state of the dynamic node 214 while awaiting operation of the NMOS logic network 208 in the evaluation phase.

During the evaluation phase, if the NMOS logic network 208 remains disabled, the dynamic node 214 retains its precharge state, and the keeper transistor 218 helps maintain the stability and robustness of the circuit. Also, CMOS domino circuits with keepers draw any static current that exists, which enables the quiescent or static current ($I_{ddq}$) in the circuit to be testable. However, the keeper transistor 218 results in a performance reduction of the circuit due to the keeper transistor's added parasitic capacitance 220 at the dynamic node 214.

While testing static CMOS circuits has received a lot of attention, little attention has been paid to testing dynamic CMOS circuits. Fault modeling is used in a testing scheme to describe the behavior of the circuit under several modes of physical defects and broadly examines ways in which that circuit can fail. Accurate fault modeling of physical defects in a circuit is needed for a good testing methodology.

Testing faults in domino logic circuits is a challenge due to their susceptibility to noise and their unique circuit topology. The footer and keeper transistors in CMOS domino circuits are used to counter problems such as charge sharing and charge leakage. The footer and keeper transistors do not directly affect the logic behavior of the circuit. Therefore, tests based on purely logical fault models cannot be used to test them. This results in a large number of faults in the footer and keeper transistors that are untestable using conventional tests that are based on purely logical fault models. The lack of an acceptable fault model for domino logic circuits contributes to the complexity of testing them.

Systems and methods are needed to detect faults in domino logic circuits, including faults in the keeper and footer devices. Systems and methods are needed for detecting faults in simple and complex circuits.

SUMMARY OF THE INVENTION

In one aspect, a domino logic circuit comprises a dynamic node, a precharge device for charging the dynamic node, and an output inverter for inverting an output of the dynamic node. A logic network is coupled to the dynamic node for discharging the dynamic node in accordance with logic. A footer device enables and disables the logic network. A keeper device is coupled to the dynamic node for retaining a charge state of the dynamic node while awaiting the logic network to operate in accordance with the logic. A test mode selection device is coupled to the dynamic node and is configured to enable a latch in the test mode. A phase selection device is configured to receive at least a wait signal and to enable selection of at least a precharge phase for charging the dynamic node to a voltage level, a write phase for generating a value to the latch based on the logic and the voltage level of the dynamic node, and a wait phase for enabling reading the value. The selection is based, at least partially, on the wait signal state.

In another aspect, a domino logic circuit comprises a dynamic node, an output inverter for inverting an output of the dynamic node, and a precharge transistor for charging the dynamic node. A logic network is coupled to the dynamic node for discharging the dynamic node in accordance with logic. A footer transistor is configured for enabling and disabling the logic network. A keeper transistor is coupled to the dynamic node for retaining a charge state of the dynamic node while awaiting the logic network to operate in accordance with the logic. A test transistor is coupled to the dynamic node and has a test enable signal as an input. The test transistor is configured to not conduct for a normal mode and to conduct for a test mode based on the test enable signal. The test transistor, the keeper transistor, and the output inverter form a write latch in the test mode when the test transistor conducts. A multiplexer has the test enable signal, a clock signal, and a wait signal as other inputs. The multiplexer is configured to enable the normal mode and the test mode for the footer transistor. The multiplexer also is configured to enable a precharge phase for the normal mode in which the precharge transistor charges the dynamic node and an evaluation phase for the normal mode in which the logic network operates on the dynamic node. The precharge phase and the evaluation phase are determined by states of the test enable signal and the clock signal. The multiplexer further is configured to enable selection of another precharge phase for the test mode in which the precharge transistor charges the dynamic node, a write phase for the test mode in which the logic network operates on the dynamic node to cause a value to be written to the write latch based on the logic, and a wait phase for the test mode for which the write latch can be read to determine if the value transitions, thereby indicating a fault. The other precharge phase, the write phase, and the wait phase are determined by other states of the test enable signal, the clock signal, and the wait signal.

Other aspects include fewer, other, or additional elements. Still other aspects include a test circuit for a complex circuit. Still other aspects include methods of the foregoing.

DETAILED DESCRIPTION

A fault dictionary of a CMOS domino logic circuit can be used to identify a fault model. In one example, a fault dictionary is determined using a CMOS domino logic full adder circuit. Although, other types of domino logic circuits may be used.

Figure 3:
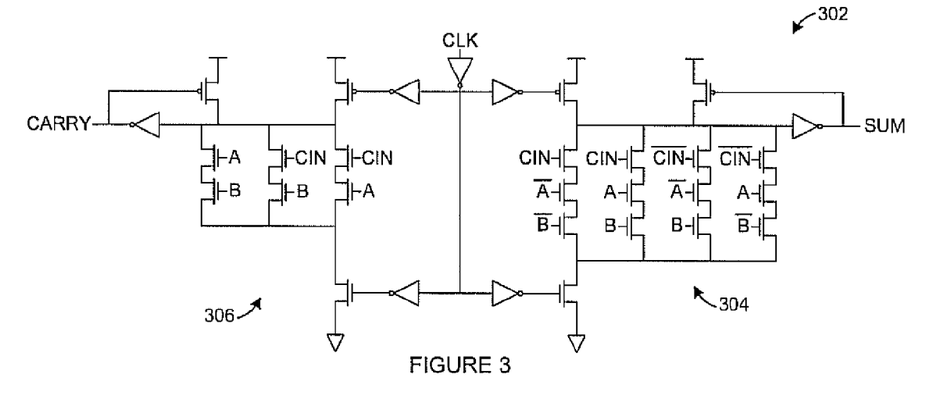
FIG. 3 is a circuit diagram of a domino logic full adder circuit.

As depicted in the example of FIG. 3, a domino logic full adder 302 includes a domino logic circuit 304 to generate a sum output (S=A⊕B⊕Cin) and a domino logic circuit 306 to generate a carry output (Co=A.B+B.Cin+A.Cin). Faults occurring in the sum (S) and the carry output (Co) of the domino logic full adder 302 are then used to identify classes of faults for the circuit.

Faults are grouped for a fault model. In the example of FIG. 3, the faults include stuck-at-0 faults, stuck-at-1 faults, transistor stuck on/open faults, floating node faults, and bridging faults. Faults that occur under this fault model include faults that make the domino logic circuit appear fault free and do not cause any quiescent or static current ($I_{ddq}$) faults. Other faults appear fault free but result in $I_{ddq}$ current faults. Other faults cause logic errors (or a delay fault) but do not cause an $I_{ddq}$ current fault. Still other faults cause logic errors (or a delay fault) and also cause an $I_{ddq}$ current fault.

Some faults have no effect on the functionality of the domino logic circuit and the current drawn by the domino logic circuit. Some of these faults are classified as undetected faults. These include a keeper gate floating fault, a keeper source floating fault, a keeper drain floating fault, a keeper stuck-on fault, a keeper stuck-open fault, a footer drain stuck-at-0 fault, a footer gate stuck-at-1 fault, a footer stuck-on fault, and a footer drain-source bridge (hard short) fault.

In the domino logic circuit, the undetected faults are located in or caused by the keeper transistor and/or the footer transistor. These faults are independent of the function being implemented by the logic of the circuit. Therefore, it would be beneficial for a fault model to detect faults in the keeper transistor and/or the footer transistor.

In one embodiment of the present invention, a testing circuit detects faults in the keeper transistor of a domino logic circuit. In another embodiment, a testing circuit detects faults in the footer transistor of a domino logic circuit. In another embodiment, a testing circuit detects faults in the keeper transistor and the footer transistor of a domino logic circuit. In still other embodiments, a testing circuit detects faults in a keeper device and/or a footer device of a domino logic circuit. Other embodiments and other functionality exist.

Figure 4:
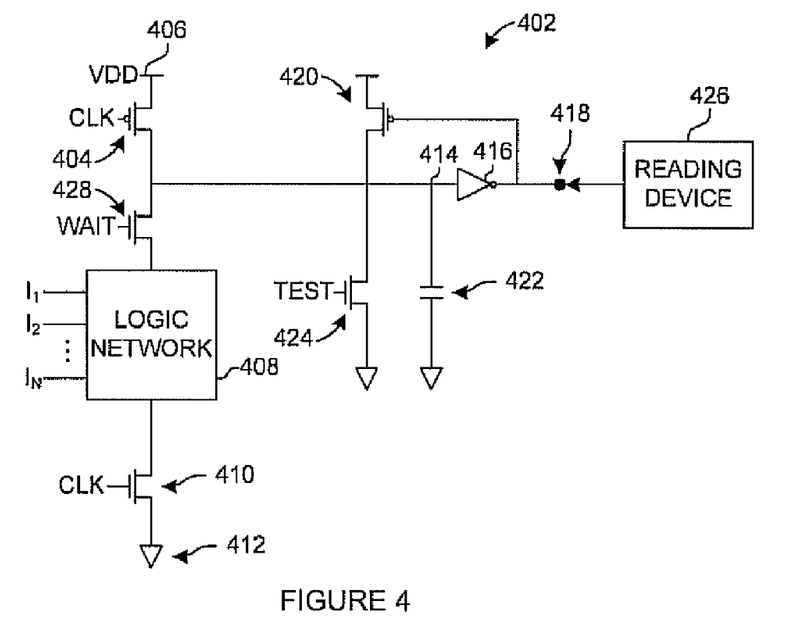
FIG. 4 is a circuit diagram of a testing domino logic circuit in accordance with an embodiment of the present invention.

FIG. 4 depicts an exemplary embodiment of a domino logic testing circuit 402 in accordance with an embodiment of the present invention. The testing circuit 402 of FIG. 4 detects faults in keeper devices, such as keeper transistors. The testing circuit 402 includes a precharge transistor 404 or other precharge device coupled to a voltage source 406 having a voltage level ($V_{dd}$), a logic network 408, an NMOS footer transistor 410 or other footer device coupled to ground 412, a dynamic node 414, and an inverter 416. In one example, $V_{dd}$ is five volts (V).

The precharge transistor 404 charges the dynamic node 414. The precharge transistor 404 has a clock signal (CLK) as an input and is controlled by the clock signal. When the clock signal is a logic zero, the precharge transistor 404 conducts and charges the dynamic node 414. When the clock signal is a logic one, the precharge transistor 404 does not conduct. In one embodiment, the precharge transistor 404 is a weak PMOS transistor. Other precharge devices may be used in other embodiments.

The logic network 408 is coupled to the dynamic node 414 and discharges the dynamic node in accordance with its logic. The logic network 408 has one or more logic inputs and one or more Boolean functions or other logic. In one embodiment, the logic network 408 is an NMOS logic network. Other logic networks may be used in other embodiments.

The footer transistor 410 enables and disables the logic network 408. The footer transistor 410 has a clock signal as an input and is controlled by the clock signal. When the clock signal is a logic zero, the footer transistor 410 does not conduct, which disables the logic network 408 from operating on the dynamic node 414. When the clock signal is a logic one, the footer transistor 410 does conduct, which enables the logic network 408 to operate on the dynamic node 414. In one embodiment, the footer transistor 410 is an NMOS transistor. Other footer devices may be used in other embodiments.

The output inverter 416 inverts the output 418 of the dynamic node 414. The output inverter 416 enables the gates of the transistors to be directly cascaded in the testing circuit 402.

The testing circuit 402 includes a keeper transistor 420 used to overcome the problems of charge leakage, charge sharing, and floating nodes. The keeper transistor 420 is coupled to the dynamic node 414 and helps retain a charge state of the dynamic node while awaiting the logic network 408 to operate in accordance with the logic. The keeper transistor 420 has an associated parasitic capacitance 422 at the dynamic node 414. In one embodiment, the keeper transistor 420 is a weak PMOS transistor used to retain the precharge state of the dynamic node 414 while awaiting operation of the NMOS logic network 408 in the evaluation phase.

The keeper transistor 420 makes the test circuit 402 operation more robust. Undetected faults in the keeper transistor 420 do not affect the correct logical operation. But, they lead to loss in robustness and may degrade reliability of the test circuit 402 due to the increase of leakage current of the dynamic node 414. The undetected faults in the keeper transistor 420 include a floating terminal fault, including a floating gate, a floating drain, and a floating source, a transistor stuck on fault or stuck open fault, and a source stuck-at-0 fault.

A test transistor 424 is coupled to the dynamic node 414. The test transistor 424 has a test enable signal as an input and is controlled by the test enable signal.

In one embodiment, the test transistor 424 is an NMOS transistor. In one example of this embodiment, the test transistor 424 is a weak NMOS transistor. In another embodiment, the test transistor 424 is sized so that it is weaker than the keeper transistor 420. In this embodiment, the test transistor 424 does not negate the effect of the keeper transistor 420 to reduce charge leakage, charge sharing, and floating nodes. The on resistance of the test transistor 424 also is much lower than the resistance of a non-conducting logic network 408 in this embodiment. In one example of this embodiment, a $W/L_{keeper}$ of the keeper transistor is approximately 8-10 times a $W/L_{test}$ of the test transistor. In another example of this embodiment, a $W/L_{keeper}$ of the keeper transistor is approximately 0.57, and a $W/L_{test}$ of the test transistor is approximately 0.07.

In another embodiment, the test transistor 424 is sized so that it is weaker than the precharge transistor 404. In this embodiment, the precharge transistor 404 is sized to be stronger than the keeper transistor 420, and the keeper transistor is sized to be stronger than the test transistor 424. Therefore, the precharge transistor 404 is sized to be stronger than the test transistor 424.

In still another embodiment, the precharge transistor 404 and the keeper transistor 420 are sized with respect to the test transistor 424 so that the precharge and keeper transistors are able to pull the dynamic node 414 to $V_{IH}$ of the output inverter 416 even with the test transistor conducting. $V_{IH}$ is the minimum high voltage that the output inverter 416 interprets as a logic one. In one example of this embodiment, a $W/L_{precharge}$ of the precharge transistor 404 is approximately 25-100 times a $W/L_{test}$ of the test transistor.

In another example of this embodiment, the precharge transistor 404 is almost approximately one hundred times the size of the test transistor 424. In this example, the dynamic node 414 may reach approximately 4.95 volts (V) if $V_{dd}$ is set at five volts.

In still another example, the precharge transistor 404 is approximately 25-50 times the size of the test transistor 424. In this example, the dynamic node 414 reaches approximately 3.1V if $V_{dd}$ is set at five volts.

The test transistor 424 detects defects in the keeper transistor 420 that cause the output 418 to change from a logic zero to a logic one. The test transistor 424 provides an alternate path to ground and accelerates the effects of charge leakage in the test circuit 402. A domino logic circuit can be tested for a faulty keeper transistor 420 by giving an input vector (inputs to the logic network 408) that does not make the logic network 408 conduct during a long evaluation phase, such as approximately a one second (1s) evaluation phase. Under such circumstances, if the keeper transistor 420 is disabled by a fault, leakage current will eventually discharge the dynamic node 414, and the fault can be detected. But, such a test generally is not as feasible because of the amount of time required by the leakage current to discharge the dynamic node. Therefore, the test transistor 424 accelerates the effect of the charge leakage and makes the test more feasible.

The test transistor 424 operates in a normal mode and a test mode based on the state of the test enable signal. The test transistor 424 does not conduct for a normal mode and conducts for a test mode.

The test transistor 424, the keeper transistor 420, and the output inverter 416 form a write latch in the test mode when the test transistor conducts. The keeper transistor 420 and the test transistor 424 form a sort of ratioed logic gate or pseudo PMOS inverter. This pseudo PMOS inverter is cross-coupled with the output inverter 416 of the dynamic node 414 to form a latch. In the test mode, a value is written to the latch, such as a logic one or a logic zero. The value then can be read from the latch, such as by a reading device 426. If the value that is read from the latch differs from the value written to the latch, a fault exists in the test circuit 402.

A phase selection transistor 428 is coupled between the dynamic node 414 and the logic network 408. The phase selection transistor 428 has a wait signal as an input and is controlled by the wait signal. In one embodiment, the phase selection transistor 428 is an NMOS transistor.

The phase selection transistor 428 detects faults in the keeper transistor 420 that change the output 418 from a logic one to a logic zero. In one example, a fault includes a keeper transistor 420 stuck-on fault. To sensitize the fault, a logic one is put at the gate of the keeper transistor 420. This requires an input vector to the logic network 408 that discharges the dynamic node 414. In the absence of the phase selection transistor 428, the much stronger NMOS pull down network, which includes the logic network 408 and the footer transistor 410, will overcome the stuck-on-keeper transistor 420. The dynamic node 414 will remain discharged, and the fault will go undetected. However, in the testing circuit 402 when the phase selection transistor 428 is turned off in the wait phase, the dynamic node 414 is disconnected from the conducting NMOS pull down network. In this instance, the stuck-on-keeper transistor 420, which is stronger than test transistor 424, re-charges the dynamic node 414. The output 418 changes from a logic one to a logic zero, thus indicating the presence of the defect.

The phase selection transistor 428 operates in the normal mode and the test mode based on the state of the test enable signal. The phase selection transistor 428 propagates states of the wait signal and/or the clock signal in the normal mode and the test mode.

In the normal mode, the phase selection transistor 428 enables a precharge phase in which the precharge transistor 404 charges the dynamic node 414 and an evaluation phase in which the logic network 408 operates on the dynamic node. The precharge phase and the evaluation phase are determined by states of the test enable signal and the clock signal.

In the test mode, the phase selection transistor 428 enables selection of a precharge phase in which the precharge transistor 404 charges the dynamic node 414, a write phase in which the logic network 408 operates on the dynamic node to cause a value to be written to the write latch based on the logic, and a wait phase for which the write latch can be read to determine if the value transitions. If the value transitions, a fault is present in the circuit. The precharge phase, the write phase, and the wait phase of the test mode are determined by states of the test enable signal, the clock signal, and the wait signal.

In one embodiment, the test circuit 402 operates in a normal (functional) mode and a test mode. In the normal mode, the wait signal is a logic one, and the test circuit 402 operates as a normal CMOS domino circuit.

In the normal mode, the test circuit 402 has two phases of operation. The first phase is a precharge phase in which the dynamic node 414 is charged to a voltage charge level. The second phase is an evaluation phase in which the test circuit 402 evaluates the inputs and the logic implemented by the logic network 408, such as one or more Boolean expressions or other logic. The precharge phase and the evaluation phase are determined by states of the test enable signal, the clock signal, and the wait signal.

In the precharge phase of the normal mode, the clock signal is a logic zero, the test enable signal is a logic zero, and the wait signal is a logic one. The phase selector transistor 428 conducts. However, the footer transistor 410 does not conduct, and the logic network 408 does not operate on the dynamic node 414. Therefore, the wait signal could be a logic zero in this phase in other embodiments. The precharge transistor 404 conducts and charges the dynamic node 414 to a voltage level, such as a voltage level $V_x$ that is approximately at $V_{dd}$ or a level between zero volts and $V_{dd}$, taking into account any voltage losses. In one example, $V_{dd} > V_x > V_{IH}$, where $V_{IH}$ is the minimum high voltage that the output inverter 416 interprets as a logic one. The output 418 of the test circuit 402 is zero in the precharge phase.

In the evaluation phase of the normal mode, the clock signal is a logic one, the test enable signal is a logic zero, and the wait signal is a logic one. The precharge transistor 404 does not conduct in the evaluation phase. The footer transistor 410 and the phase selector transistor 428 do conduct, and the logic network 408 operates on the dynamic node 414 in accordance with the inputs and logic of the logic network. In one embodiment, the setup and hold time of the memory element that is used to capture the output 418 along with the time for the dynamic node 414 to discharge (on application of the appropriate inputs) is included in the time for which the clock signal is a logic one.

In the test mode, the test circuit 402 has three phases of operation. The first phase is a precharge phase in which the dynamic node 414 is charged to a voltage charge level. The second phase is a write phase in which the logic of the logic network 408 is implemented to operate on the dynamic node 414 and to write a value to a location based on the logic. The third phase is a wait phase in which the value can be read. The precharge phase, the write phase, and the wait phase are determined by states of the test enable signal, the clock signal, and the wait signal.

The test enable signal is a logic one in the test mode. The keeper transistor 420 and the test transistor 424 form a sort of ratioed logic gate or pseudo PMOS inverter. This pseudo PMOS inverter is cross-coupled with the output inverter 416 of the dynamic node 414 to form a latch. In the test mode, a value is written to the latch, such as a logic one or a logic zero. The value then can be read from the latch. If the value that is read from the latch differs from the value written into the latch, a fault exists in the test circuit 402. In one example, if the value that is read from the latch differs from the value written into the latch, a fault exists in the keeper transistor 420.

In the precharge phase of the test mode, the clock signal is a logic zero, the test enable signal is a logic one, and the wait signal is a logic one. The phase selector transistor 428 conducts. However, the footer transistor 410 does not conduct, and the logic network 408 does not operate on the dynamic node 414. Therefore, the wait signal could be a logic zero in this phase in other embodiments. The precharge transistor 404 conducts and charges the dynamic node 414 to a voltage level, such as a voltage level $V_x$ that is approximately at $V_{dd}$ or a level between zero volts and $V_{dd}$, taking into account any voltage losses. In one example, $V_{dd} > V_x > V_{IH}$, where $V_{IH}$ is the minimum high voltage that the output inverter 416 interprets as a logic one. The output 418 of the test circuit 402 is zero in the precharge phase.

In the write phase of the test mode, the clock signal is a logic one, the test enable signal is a logic one, and the wait signal is a logic one. The precharge transistor 404 does not conduct. The footer transistor 410, the test transistor 424, and the phase selection transistor 428 do conduct. The footer transistor 410 and the logic network 408 form a pull down network. The logic network 408 operates on the dynamic node 414 in accordance with the logic, resulting in a value being written to the latch formed by the keeper transistor 420, the test transistor 424, and the output inverter 416. At the end of this write phase, the dynamic node 414 either discharges or remains at the voltage charge level, depending on the inputs and the logic of the logic network 408. Likewise, the output 418 of the latch remains at a logic zero or changes to a logic one depending on the inputs and the logic of the logic network 408. In one embodiment, the write phase is just long enough for the dynamic node 414 to discharge through the pull down network, which includes the logic network 408 and the footer transistor 410. In one example, this discharge time is the hold time for a normal CMOS domino gate. In another example, the write phase is approximately two nanoseconds (ns).

In the wait phase of the test mode, the clock signal is a logic one, the test enable signal is a logic one, and the wait signal is a logic zero. The precharge transistor 404 does not conduct. The footer transistor 410 and the test transistor 424 do conduct. However, the phase selection transistor 428 does not conduct.

Figure 5:
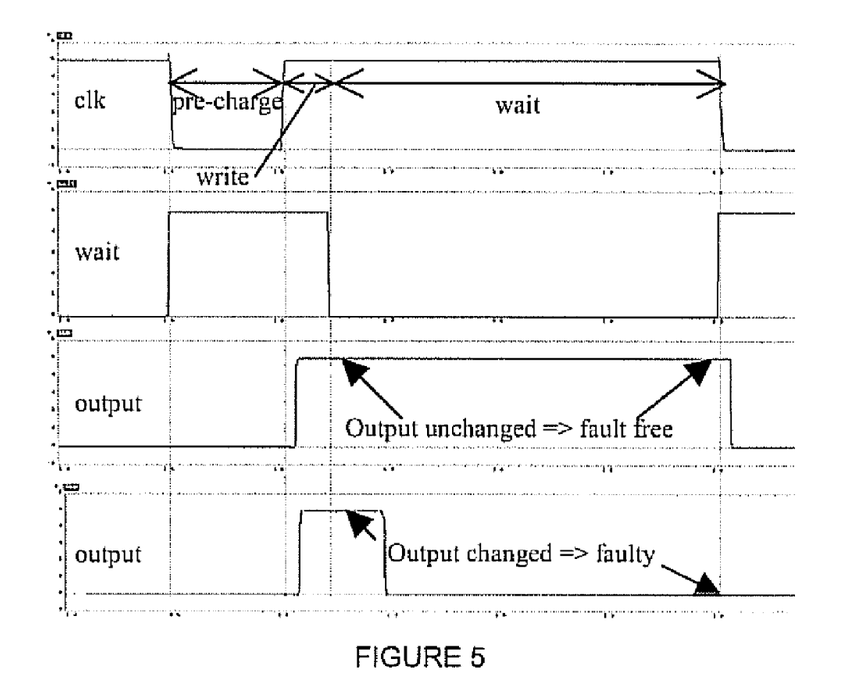
FIG. 5 is a diagram of phases of operation of the testing domino logic circuit of FIG. 4 in a test mode accordance with an embodiment of the present invention.

Since the wait signal as at a logic zero and the clock signal is at a logic one in the wait phase, the dynamic node 414, which is the input to the latch, is in a high impedance state. During this wait phase, the cross-coupled inverter pair that form the latch is supposed to maintain the logic level of the output 418. A defect in the keeper transistor 420 or the output inverter 416 will degrade the output 418 of the latch during the wait phase. Therefore, a defect can be detected by comparing the value of the output 418 at the beginning of the wait phase and the end of the wait phase. A change in the value indicates the presence of a defect. FIG. 5 illustrates one embodiment of different phases of operation in the test mode with examples of a fault-free and faulty output.

In one embodiment, a sufficient amount of time is selected for the wait phase to enable the output 418 to stabilize before the wait signal state is changed from a logic one to a logic zero. In one example, the selected time for the wait signal state change is ten nanoseconds (ns). In another embodiment, the time is selected to enable the output 418 to stabilize after the wait state signal is changed from a logic one to a logic zero but before the latch is read. In one example, the selected time for reading the latch after the wait signal state change is ten nanoseconds (ns).

In one embodiment, the frequency at which the test circuit 402 is tested is below the operating frequency of the test circuit. In one example, the test frequency is lower than the operating frequency because the detection of the faults depends on the dynamic node 414 discharging through the test transistor 424 or charging through the keeper transistor 420, both of which are weak transistors. In another example, the test frequency is between 40 MHz and 50 MHz. In another example, the test frequency is 45 Mhz. In another example, the operating frequency is 200 MHz. In still another example, a maximum test frequency is the greater of (1) the time taken by the dynamic node 414 to discharge from $V_x$ to $V_{IL}$ through the test transistor 424 and (2) the time taken by the dynamic node to charge from zero to $V_{IH}$ through the keeper transistor 420 while the test transistor is conducting. $V_{IL}$ is the maximum low voltage that the output inverter 416 recognizes as a logic zero.

Figure 6:
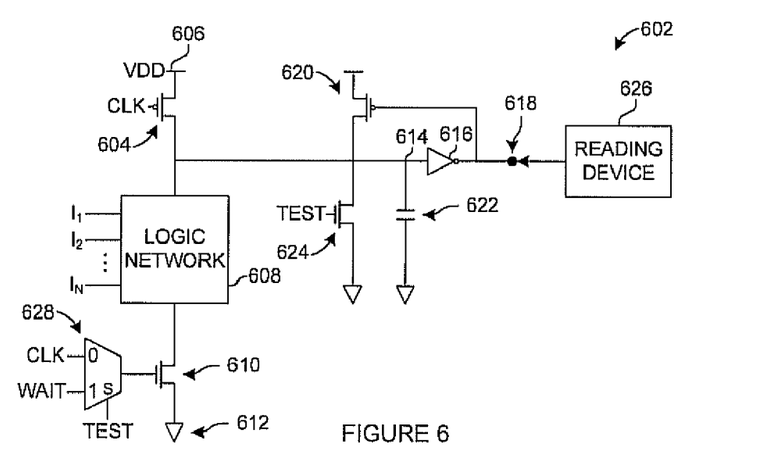
FIG. 6 is a circuit diagram of a testing domino logic circuit in accordance with another embodiment of the present invention.

FIG. 6 depicts an exemplary embodiment of another domino logic testing circuit 602 in accordance with an embodiment of the present invention. The testing circuit 602 of FIG. 6 detects faults in footer devices and keeper devices, such as footer transistors and keeper transistors.

The testing circuit 602 includes a precharge transistor 604 or other precharge device coupled to a voltage source 606 having a voltage level ($V_{dd}$), a logic network 608, an NMOS footer transistor 610 or other footer device coupled to ground 612, a dynamic node 614, an output inverter 616 that inverts the output 618 and enables transistors to be directly cascaded in the testing circuit 602, and a keeper transistor 620 or other keeper device with its associated capacitance 622. The precharge transistor 604, the logic network 608, the dynamic node 614, the inverter 616, the output 618, the keeper 620, and the capacitance 622 are the same as the precharge transistor 404, the logic network 408, the dynamic node 414, the inverter 416, the output 418, the keeper transistor 420, and the capacitance 422 described with respect to FIG. 4. In one example, $V_{dd}$ is five volts (V).

The footer transistor 610 enables and disables the logic network 608. The footer transistor 610 has a clock signal (CLK) and a wait signal as inputs and is controlled by the clock signal and the wait signal. When the clock signal is a logic zero, the footer transistor 610 does not conduct, which disables the logic network 608 from operating on the dynamic node 614. When the clock signal is a logic one, the footer transistor 610 does conduct, which enables the logic network 608 to operate on the dynamic node 614. The wait signal is propagated to the footer transistor 610 in the test mode. When the clock signal and/or the wait signal is a logic zero, the footer transistor 610 does not conduct, which disables the logic network 608 from operating on the dynamic node 614. When the wait signal and the clock signal are a logic one, the footer transistor 610 conducts, which enables the logic network 608 to operate on the dynamic node 614. In one embodiment, the footer transistor 610 is an NMOS transistor. Other footer devices may be used in other embodiments.

The domino logic testing circuit 602 also has a test enable transistor 624 or other test mode selection device that is coupled to the dynamic node 614. The test transistor 624 has a test enable signal as an input and is controlled by the test enable signal.

In one embodiment, the test transistor 624 is an NMOS transistor. In one example of this embodiment, the test transistor 624 is a weak NMOS transistor. In another embodiment, the test transistor 624 is sized so that it is weaker than the keeper transistor 620. In this embodiment, the test transistor 624 does not negate the effect of the keeper transistor 620 to reduce charge leakage, charge sharing, and floating nodes. The on resistance of the test transistor 624 also is much lower than the resistance of a non-conducting logic network 608 in this embodiment. In one example of this embodiment, a $W/L_{keeper}$ of the keeper transistor is approximately 8-10 times a $W/L_{test}$ of the test transistor. In another example of this embodiment, a $W/L_{keeper}$ of the keeper transistor is approximately 0.57, and a $W/L_{test}$ of the test transistor is approximately 0.07.

In another embodiment, the test transistor 624 is sized so that it is weaker than the precharge transistor 604. In this embodiment, the precharge transistor 604 is sized to be stronger than the keeper transistor 620, and the keeper transistor is sized to be stronger than the test transistor 624. Therefore, the precharge transistor 604 is sized to be stronger than the test transistor 624.

In still another embodiment, the precharge transistor 604 and the keeper transistor 620 are sized with respect to the test transistor 624 so that the precharge and keeper transistors are able to pull the dynamic node 614 to $V_{IH}$ (min) of the output inverter 616 even with the test transistor conducting. $V_{IH}$ (min) is a minimum high voltage recognized by the output inverter 616 as a logic one. In one example of this embodiment, a $W/L_{precharge}$ of the precharge transistor 604 is approximately 25-100 times a $W/L_{test}$ of the test transistor.

In another example of this embodiment, the precharge transistor 604 is almost approximately one hundred times the size of the test transistor 624. In this example, the dynamic node 614 may reach approximately 4.95 volts (V) if $V_{dd}$ is set at five volts.

In still another example, the precharge transistor 604 is approximately 25-50 times the size of the test transistor 624. In this example, the dynamic node 614 reaches approximately 3.1V if $V_{dd}$ is set at five volts.

The test transistor 624 detects the defects in the keeper transistor 620 that cause the output 618 to change from a logic zero to a logic one. The test transistor 624 provides an alternate path to ground and accelerates the effects of charge leakage in the test circuit 602. A domino logic circuit can be tested for a faulty keeper transistor 620 by giving an input vector (inputs to the logic network 608) that does not make the logic network 608 conduct during a long evaluation phase, such as approximately a one second (is) evaluation phase. Under such circumstances, if the keeper transistor 620 is disabled by a fault, leakage current will eventually discharge the dynamic node 614, and the fault can be detected. But, such a test normally is not as feasible because of the amount of time required the by leakage current to discharge the dynamic node 614. Therefore, the test transistor 624 accelerates the effect of charge leakage and makes the test more feasible.

The test transistor 624 operates in a normal mode and a test mode based on the state of the test enable signal. The test transistor 624 does not conduct for a normal mode and conducts for a test mode.

The test transistor 624, the keeper transistor 620, and the output inverter 616 form a write latch in the test mode when the test transistor conducts. The keeper transistor 620 and the test transistor 624 form a sort of ratioed logic gate or pseudo PMOS inverter. This pseudo PMOS inverter is cross-coupled with the output inverter 616 of the dynamic node 614 to form a latch. In the test mode, a value is written to the latch, such as a logic one or a logic zero. The value then can be read from the latch, such as by a reading device 626. If the value that is read from the latch differs from the value written to the latch, a fault exists in the test circuit 602.

A multiplexer 628 or other test phase selection device is coupled to the footer transistor 610. The multiplexer 628 has a test enable signal, a clock signal, and a wait signal as inputs. The multiplexer 628 propagates states of the clock signal and the wait signal to the footer transistor 610. The test enable signal determines whether or not the multiplexer 628 propagates the wait signal inputs to the footer transistor 610. One multiplexer 628 can be shared among multiple domino logic circuits. In one embodiment, the multiplexer 628 is a 2:1 multiplexer.

The multiplexer 628 causes faults to be detected in the keeper transistor 620 that change the output 618 from a logic one to a logic zero. The multiplexer 628 also causes faults to be detected in the footer transistor 610.

In one example, a fault includes a keeper transistor 620 stuck-on fault. To sensitize the fault, a logic one is put at the gate of the keeper transistor 620. This requires an input vector to the logic network 608 that discharges the dynamic node 614. In the absence of the multiplexer 628 rendering the footer transistor 610 non-conducting, the much stronger NMOS pull down network, which includes the logic network 608 and the footer transistor 610, will overcome the stuck-on-keeper transistor 620. The dynamic node 614 will remain discharged, and the fault will go undetected. However, in the testing circuit 602 when the multiplexer 628 is turned off in the wait phase, the dynamic node 614 is disconnected from the NMOS pull down network. In this instance, the stuck-on-keeper transistor 620, which is stronger than test transistor 624, re-charges the dynamic node 614. The output 618 changes from a logic one to a logic zero, thus indicating the presence of a defect.

The multiplexer 628 operates in a normal mode and a test mode based on the state of the test enable signal. The multiplexer 628 propagates states of the clock signal in the normal mode and propagates states of the clock signal and the wait signal in the test mode.

In the normal mode, the multiplexer 628 enables a precharge phase in which the precharge transistor 604 charges the dynamic node 614 and an evaluation phase in which the logic network 608 operates on the dynamic node. The precharge phase and the evaluation phase are determined by states of the test enable signal and the clock signal.

In the test mode, the multiplexer 628 enables selection of a precharge phase in which the precharge transistor 604 charges the dynamic node 614, a write phase in which the logic network 608 operates on the dynamic node to cause a value to be written to the write latch based on the logic, and a wait phase for which the write latch can be read to determine if the value transitions. If the value transitions, a fault is present in the circuit. The precharge phase, the write phase, and the wait phase of the test mode are determined by states of the test enable signal, the clock signal, and the wait signal.

Figure 7:
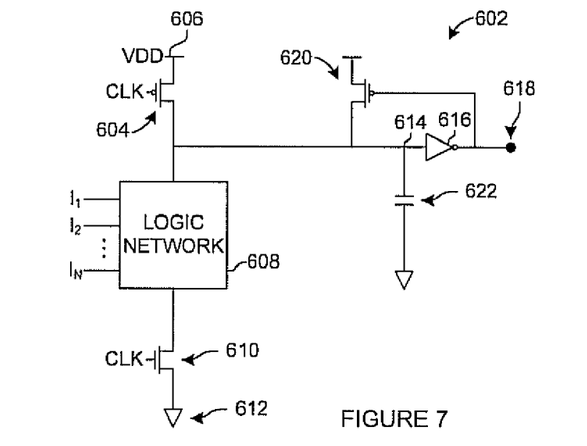
FIG. 7 is a circuit diagram of the testing domino logic circuit of FIG. 6 in a normal mode in accordance with an embodiment of the present invention.

The test circuit 602 operates in a normal (functional) mode and a test mode. In the normal mode, the test enable signal is a logic zero. Therefore, the test transistor 624 does not conduct, and the test circuit 602 operates as a normal CMOS domino logic circuit. The effective circuit for the normal mode is depicted in FIG. 7.

In the normal mode, the test circuit 602 has two phases of operation. The first phase is a precharge phase in which the dynamic node 614 is charged to a voltage charge level. The second phase is an evaluation phase in which the test circuit 602 evaluates the inputs and the logic implemented by the logic network 608, such as one or more Boolean expressions or other logic. The precharge phase and the evaluation phase are determined by states of the test enable signal, the clock signal, and the wait signal.

In the precharge phase of the normal mode, the test enable signal is a logic zero, and the clock signal is a logic zero. The wait signal is not propagated to the footer transistor 610, and the test transistor 624 does not conduct. The footer transistor 610 does not conduct, and the logic network 608 does not operate on the dynamic node 614. The precharge transistor 604 conducts and charges the dynamic node 614 to a voltage level, such as a voltage level $V_x$ that is approximately at $V_{dd}$ or a level between zero volts and $V_{dd}$, taking into account any voltage losses. In one example, $V_{dd} > V_x > V_{IH}$, where $V_{IH}$ is the minimum high voltage that the output inverter 616 interprets as a logic one. The output 618 of the test circuit 602 is zero in the precharge phase.

In the evaluation phase of the normal mode, the test enable signal is a logic zero, and the clock signal is a logic one. The wait signal is not propagated to the footer transistor 610, and the test transistor 624 does not conduct. The precharge transistor 604 does not conduct in the evaluation phase. The multiplexer 628 transmits the clock signal to the footer transistor 610. The footer transistor 610 does conduct, and the logic network 608 operates on the dynamic node 614 in accordance with the inputs and logic of the logic network. In one embodiment, the setup and hold time of the memory element that is used to capture the output 618 along with the time for the dynamic node 614 to discharge (on application of the appropriate inputs) is included in the time for which the clock signal is a logic one.

In the test mode, the test circuit 602 has three phases of operation. The first phase is a precharge phase in which the dynamic node 614 is charged to a voltage charge level. The second phase is a write phase in which the logic of the logic network 608 is implemented to operate on the dynamic node 614 and to write a value to a location based on the logic. The third phase is a wait phase in which the value can be read. The precharge phase, the write phase, and the wait phase are determined by states of the test enable signal, the clock signal, and the wait signal.

In the test mode, the test enable signal is a logic one, and the multiplexer 628 propagates the wait signal to the gate of the footer transistor 610. The keeper transistor 620 and the test transistor 624 form a sort of ratioed logic gate or pseudo PMOS inverter. This pseudo PMOS inverter is cross-coupled with the output inverter 616 of the dynamic node 614 to form a latch. In the test mode, a value is written to the latch, such as a logic one or a logic zero. The value then can be read from the latch. If the value that is read from the latch differs from the value written into the latch, a fault exists in the test circuit 602. In one example, if the value that is read from the latch differs from the value written into the latch, a fault exists in the keeper transistor 620 and/or the footer transistor 610.

Figure 8:
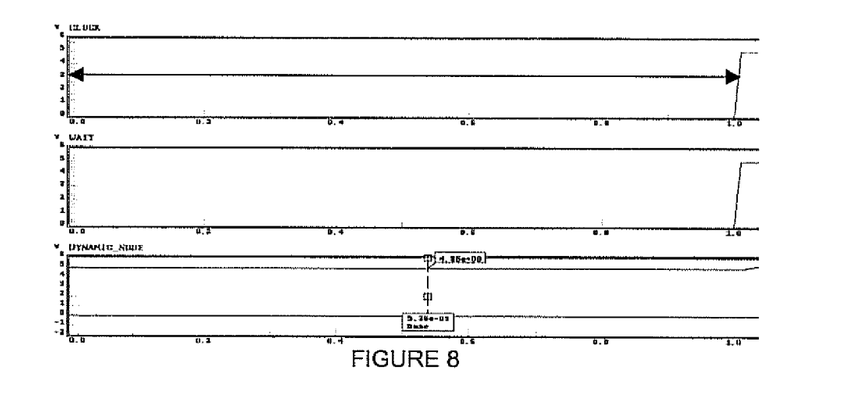
FIG. 8 is a diagram of a precharge phase of the testing domino logic circuit of FIG. 6 in accordance with an embodiment of the present invention.

In the precharge phase of the test mode, the test enable signal is a logic one, the clock signal is a logic zero, and the wait signal is a logic zero. The multiplexer 628 propagates the wait signal to the footer transistor 610. The footer transistor 610 does not conduct, and the logic network 608 does not operate on the dynamic node 614. The precharge transistor 604 and the test transistor 624 conduct and form a voltage divider. In this example, the precharge transistor 604 is stronger than the test transistor 624, and the dynamic node 614 charges to a voltage level, such as a voltage level $V_x$ that is approximately at $V_{dd}$ or a level between zero volts and $V_{dd}$, taking into account any voltage losses. In one example, $V_{dd} > V_x > V_{IH}$, where $V_{IH}$ is the minimum high voltage that the output inverter 616 interprets as a logic one. The output 618 of the test circuit 602 is zero in the precharge phase. FIG. 8 illustrates an example of a precharge phase for the test mode.

In the write phase of the test mode, the test enable signal is a logic one, the clock signal is a logic one, and the wait signal is a logic one. The multiplexer 628 propagates the wait signal to the footer transistor 610. The precharge transistor 604 does not conduct. The test transistor 624 and the footer transistor 610 do conduct. The footer transistor 610 and the logic network 608, which form a pull down network, operate on the dynamic node 614 in accordance with the logic, resulting in a value being written to the latch formed by the keeper transistor 620, the test transistor 624, and the output inverter 616. At the end of this write phase, the dynamic node 614 either discharges or remains at the voltage charge level, depending on the inputs and the logic of the logic network 608. Likewise, the output 618 of the latch remains at a logic zero or changes to a logic one depending on the inputs and the logic of the logic network 608. In one embodiment, the write phase is just long enough for the dynamic node 614 to discharge through the pull down network, which includes the logic network 608 and the footer transistor 610. In one example, this discharge time is the hold time for a normal CMOS domino gate.

Figure 9:
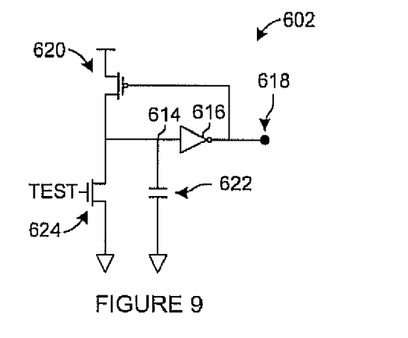
FIG. 9 is a circuit diagram of the testing domino logic circuit of FIG. 6 in a wait phase in accordance with an embodiment of the present invention.

In the wait phase of the test mode, the test enable signal is a logic one, the clock signal is a logic one, and the wait signal is a logic zero. The multiplexer 628 propagates the wait signal to the footer transistor 610. The precharge transistor 604 does not conduct. The footer transistor 610 and the logic network 608, which form a pull down network, do not conduct, and the logic network 608 does not operate on the dynamic node 614. The test transistor 624 does conduct. The effective circuit is depicted in FIG. 9.

In the wait phase, the dynamic node 614 is the input to the latch. During this wait phase, the cross-coupled inverter pair that form the latch is supposed to maintain the logic level of the output 618. A defect in the keeper transistor 620, the output inverter 616, or the footer transistor 610 will degrade the output 618 of the latch during the wait phase. Therefore, a defect in the keeper transistor 620 or the footer transistor 610 can be detected by comparing the value of the output 618 at the beginning of the wait phase and the end of the wait phase. A change in the value indicates the presence of a defect.

In one embodiment, a sufficient amount of time is selected for the wait phase to enable the output 618 to stabilize before the wait signal state is changed from a logic one to a logic zero. In one example, the selected time for wait signal state change is ten nanoseconds (ns). In another embodiment, the time is selected to enable the output 618 to stabilize after the wait state signal is changed from a logic one to a logic zero but before the latch is read. In one example, the selected time for reading the latch after the wait signal state change is ten nanoseconds (ns).

Figure 10:
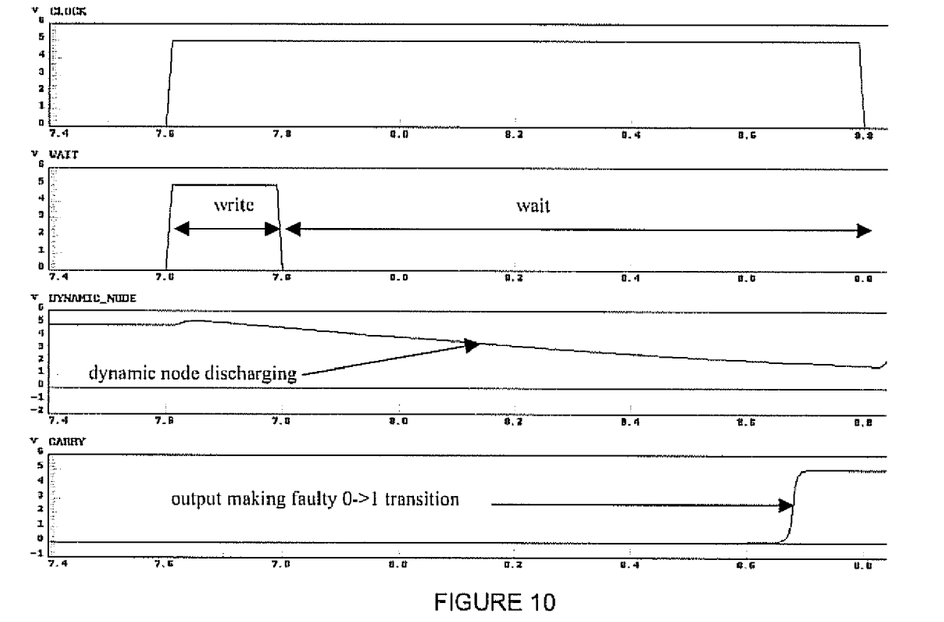
FIG. 10 is a diagram of a fault detection in the testing domino logic circuit of FIG. 6 in accordance with an embodiment of the present invention.

In one embodiment, keeper stuck open type faults are detected. In one example of this embodiment, faults are detected where the keeper transistor 620 is not conducting, including a keeper source stuck-at-0 fault, a keeper source floating fault, a keeper drain floating fault, and a keeper stuck-open fault. In this example, the pull down network, which includes the logic network 608 and the footer transistor 610, does not conduct during the write phase. In the wait phase, the dynamic node 614 discharges through the test transistor 624. Since the keeper transistor 620 is disabled, the voltage level in the dynamic node 614 is not replenished. When the voltage level at the dynamic node 614 falls below $V_{IL}$ of the output inverter 616, the output 618 makes a faulty transition from a logic zero to a logic one. $V_{IL}$ is the maximum low voltage that the output inverter 616 recognizes as a logic zero. FIG. 10 illustrates an example of this type of fault detection.

Figure 11:
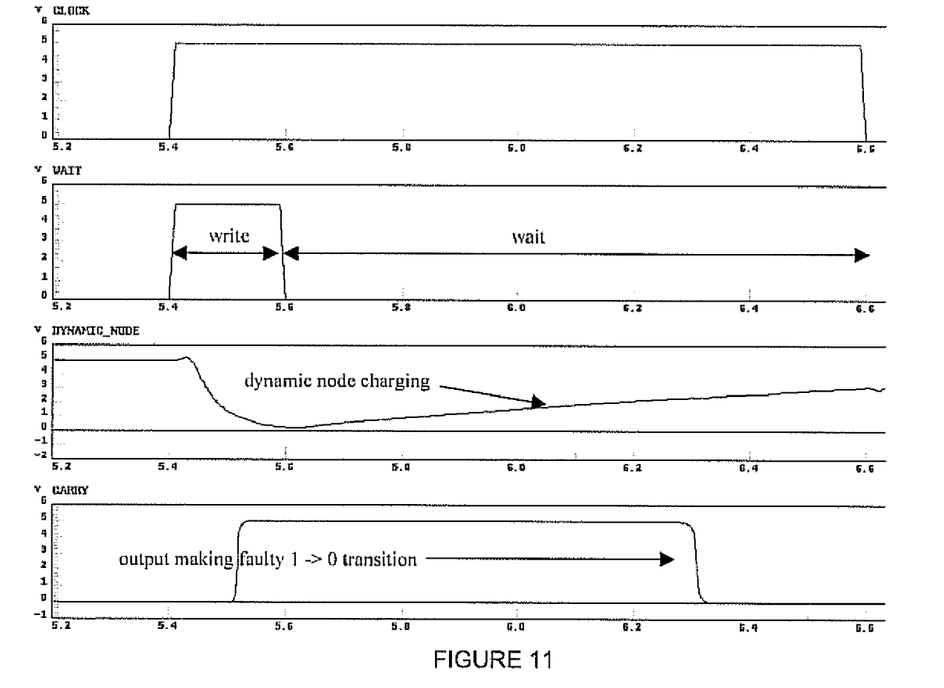
FIG. 11 is a diagram of a fault detection in the testing domino logic circuit of FIG. 6 in accordance with an embodiment of the present invention.

In another embodiment, keeper stuck on type faults are detected. In one example of this embodiment, faults are detected where the keeper transistor 620 is always conducting, including a keeper gate floating fault and a keeper stuck-on fault. In this example, the pull down network, which includes the logic network 608 and the footer transistor 610, conducts during the write phase. Therefore, the output 618 at the end of write phase is a logic one, and the keeper transistor 620 is not supposed to be conducting (i.e. cut off). However, the dynamic node 614 begins to charge through the stuck-on keeper transistor 620 during the wait phase. When the voltage level at the dynamic node 614 rises above $V_{IH}$ of the output inverter 616, the output 618 makes a faulty transition from a logic one to a logic zero. $V_{IH}$ is the minimum high voltage that the output inverter 616 recognizes as a logic one. FIG. 11 illustrates an example of this type of fault detection.

Figure 12:
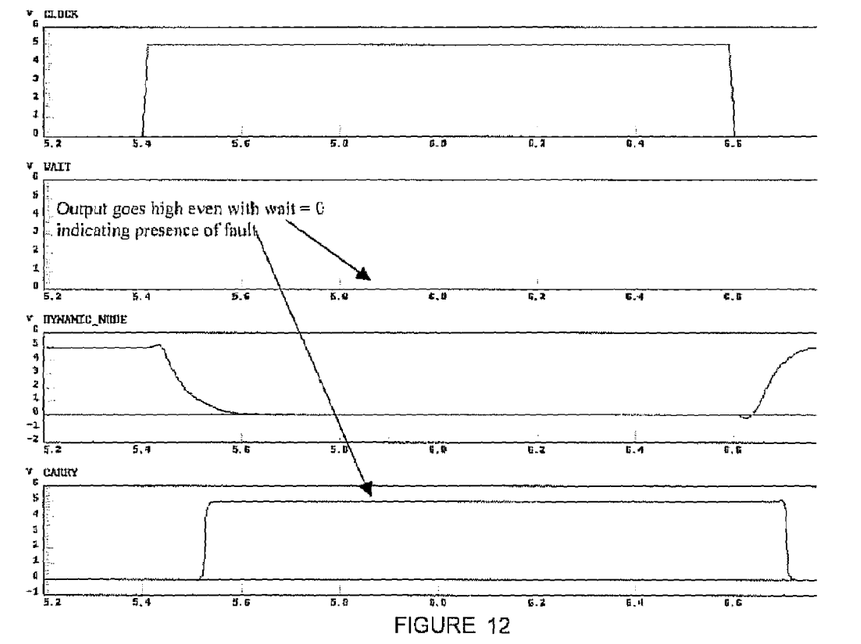
FIG. 12 is a diagram of a fault detection in the testing domino logic circuit of FIG. 6 in accordance with an embodiment of the present invention.

In another embodiment, footer type faults are detected. In one example of this embodiment, faults are detected where the footer transistor 610 conducts when it is not intended to conduct, including a footer drain stuck-at-0 fault, a footer gate stuck-at-1 fault, a footer stuck-on fault, and a footer drain-source bridge (hard short) fault. To detect faults in the footer transistor 610, the inputs (input vectors) that make the logic network 608 conduct are applied in the test mode when the clock signal is a logic one. However, the wait signal is kept at a logic zero throughout this phase. In the absence of any faults, the output 618 should remain at a logic zero since the footer transistor 610 is not conducting. If any of the footer faults are present, the output 618 will transition from a logic zero to a logic one. FIG. 12 illustrates an example of this type of fault detection.

In one embodiment, the frequency at which the test circuit 602 is tested is below the operating frequency of the test circuit. In one example, the test frequency is lower than the operating frequency because the detection of the faults depends on the dynamic node 614 discharging through the test transistor 624 or charging through the keeper transistor 620, both of which are weak transistors. In another example, the test frequency is between 40 MHz and 50 MHz. In another example, the test frequency is 45 Mhz. In another example, the operating frequency is 200 MHz. In still another example, a maximum test frequency is the greater of (1) the time taken by the dynamic node 614 to discharge from $V_x$ to $V_{IL}$ through the test transistor 624 and (2) the time taken by the dynamic node to charge from zero to $V_{IH}$ through the keeper transistor 620 while the test transistor is conducting. $V_{IL}$ is the maximum low voltage that the output inverter 616 recognizes as a logic zero.

The test circuit may be used for complex circuits as well as simple circuits. The multiplexer 628 can be shared by different domino logic gates in the logic circuits. In one embodiment, the multiplexer 628 is shared when the domino logic gates are not in the same chain and their outputs are observed independently. In one example, the multiplexer 628 receives the clock signal, the wait signal, and the test enable signal as inputs. In another example, the multiplexer 628 propagates states of the wait signal and states of the clock signal to each footer device in the complex circuit when the test enable signal is a logic one. In another example, the multiplexer 628 propagates states of the clock signal to each footer device in the complex circuit when the test enable signal is a logic zero.

In one embodiment, each dynamic node in the complex circuit has an associated test transistor. Each test transistor has a test enable signal as an input and enables a normal mode and a test mode as described above.

Figure 13:
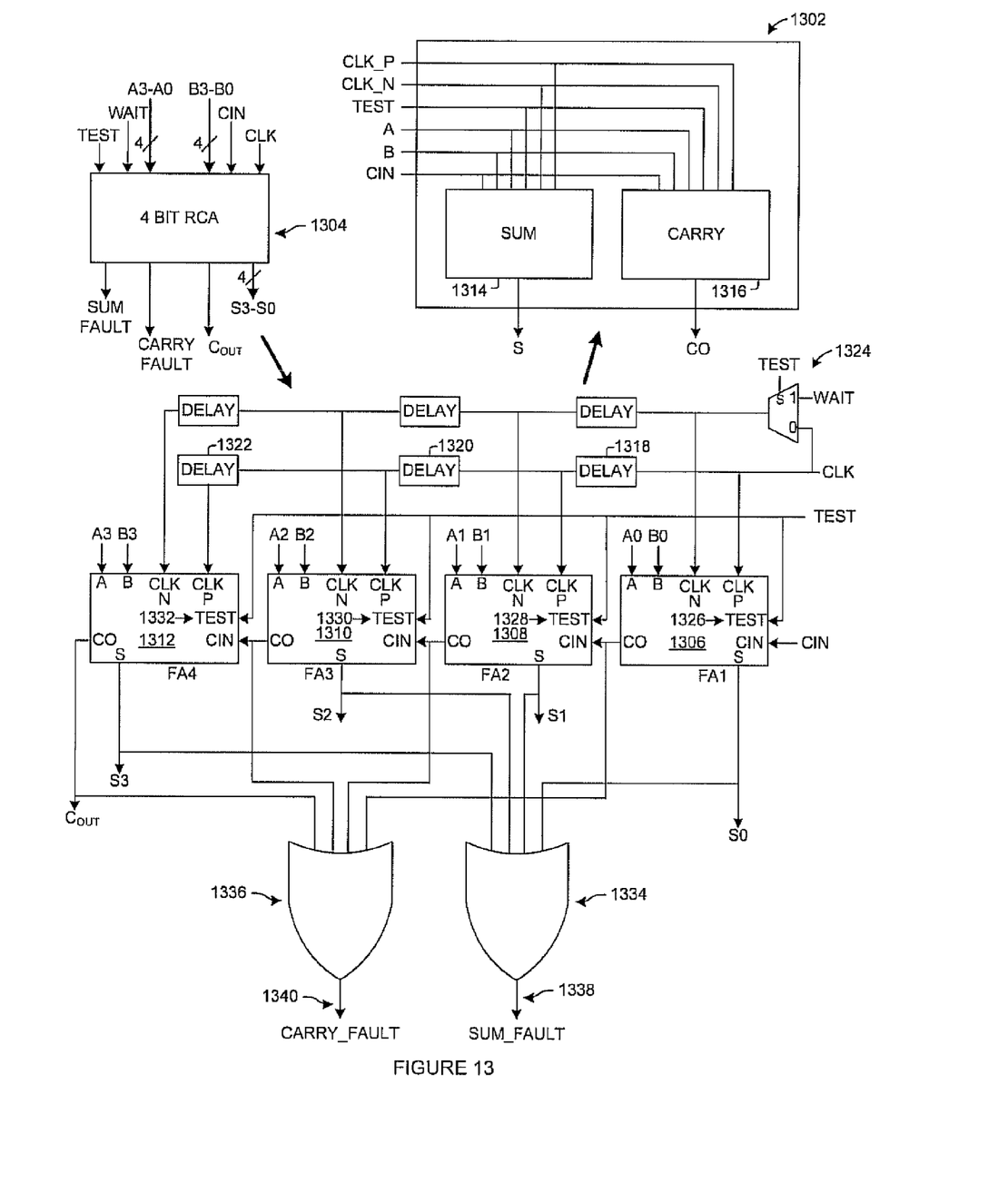
FIG. 13 is a circuit diagram of a testing domino logic circuit in accordance with another embodiment of the present invention.

FIG. 13 depicts an exemplary embodiment of a test circuit 1302 for a complex circuit, such as a four-bit ripple carry adder (RCA) circuit 1304. In one example, the RCA includes four stages 1306-1312 of CMOS domino logic full adder circuits, such as the full adder 302 depicted in FIG. 3.

In the test circuit 1302 of FIG. 13, each full adder circuit 1306-1312 includes a sum domino logic circuit 1314 and a carry domino logic circuit 1416 to evaluate the sum (S) and the carry output (Co) at each stage. Except the most significant bit (MSB) full adder 1312, the carry output of each full adder circuit 1306-1310 is cascaded with the sum and carry output domino circuits 1314-1316 to the next full adder.

Delay elements 1318-1322 are placed between each stage 1306-1312 to delay the clock (CLK) signal at each stage to avoid race conditions. The inputs A3-A0, B3-B0, and Carry in (Cin) are fed simultaneously to each stage 1306-1312 in the circuit 1304, and the carry output "ripples" from one stage to the next. If the clock signal is not delayed at every stage 1306-1312 after the least significant bit (LSB), the sum and carry output sub-circuits 1314-1316 will evaluate their outputs before the carry input "ripples" through the previous stages. This would result in a race condition. In one embodiment, the delay elements 1318-1322 are static CMOS buffers. In one example of this embodiment, the delay elements 1318-1322 delay the clock signal by 1.5 nano-seconds (ns) at each stage 1306-1312.

A multiplexer 1324 is connected to, and shared with, each footer device of each stage 1306-1312 in the complex circuit 1302. The multiplexer 1324 receives the clock signal (CLK), the wait signal, and the test enable signal as inputs. The multiplexer 1324 propagates states of the wait signal and states of the clock signal to each footer device of each stage 1306-1312 in the complex circuit 1302 when the test enable signal is a logic one. The multiplexer 1324 propagates states of the clock signal to each footer device of each stage 1306-1312 in the complex circuit 1302 when the test enable signal is a logic zero. The clock signal includes a CLK_P clock signal that is fed to each precharge device and a CLK_N clock signal that is fed to each footer device. In each full adder stage 1306-1312, the CLK_P signal is fed to the precharge device, while the CLK_N clock signal is fed to the footer device.

The dynamic node of each domino logic sum circuit 1314 and each domino logic carry circuit 1316 in the complex circuit 1302 has an associated test transistor 1326-1332. Each test transistor 1326-1332 has a test enable signal as an input, is controlled by the test enable signal, and enables a normal mode and a test mode as described above.

The test transistors 1326-1332 and the multiplexer 1324 operate the same and have the same inputs as the test transistor 624 and the multiplexer 628 described above for the test circuit 602 of FIG. 6, except the clock signal (CLK) in this embodiment is divided into the CLK_P clock signal and the CLK_N clock signal. The multiplexer 1324, the test transistors 1326-1332, their inputs, and the resulting modes and phases of operation enable the complex circuit 1302 to detect faults in the keeper devices and footer devices of each sum and carry domino circuit 1314 and 1316.

The sum and carry outputs of all four full adders 1306-1312 are passed to a logic gate for evaluation. In the example of FIG. 13, the sum and carry outputs are passed to OR gates 1334-1336 to generate a sum fault signal 1338 and a carry fault signal 1340. The presence of a fault is detected by observing the sum fault signal 1338 and the carry fault signal 1340 outputs at the end of the wait phase in the test mode.

Figure 14:
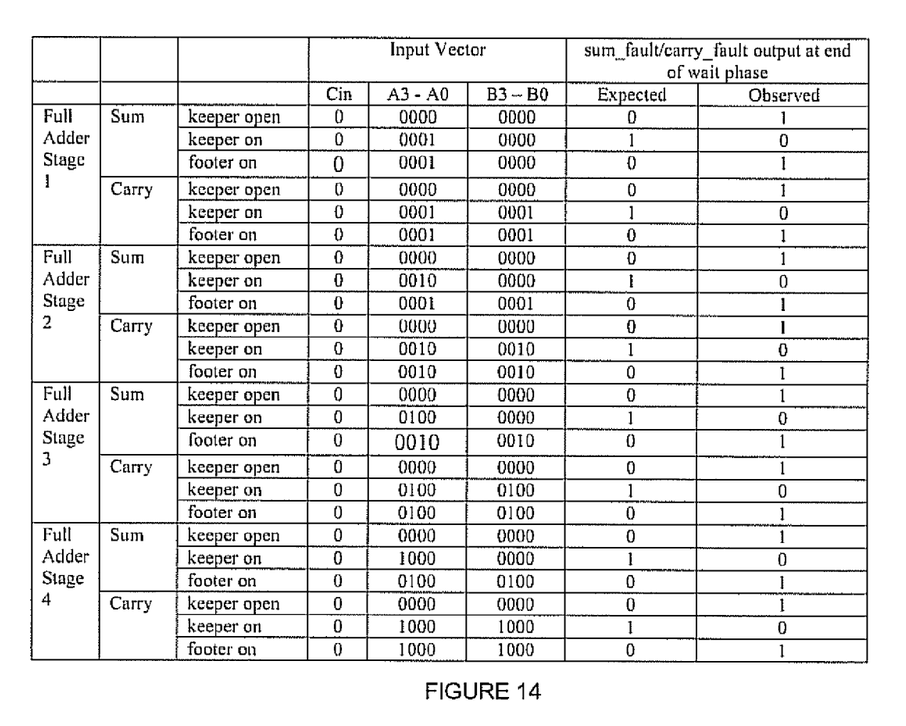
FIG. 14 is a table of faults detected for a testing domino logic circuit in accordance with another embodiment of the present invention.

FIG. 14 identifies an example of input vectors used in one or more embodiments and the results of the fault detections.

In another embodiment, the test circuit is used for a complex circuit. The complex circuit includes a plurality of domino logic circuits. Each domino logic circuit has a dynamic node, an output inverter for inverting an output of the dynamic node, and a precharge transistor for charging the dynamic node. A logic network is coupled to each dynamic node for discharging the dynamic node in accordance with logic. A footer device enables and disables each logic network. A keeper transistor is coupled to each dynamic node for retaining a charge state of the dynamic node while awaiting the corresponding logic network to operate in accordance with its logic state. A test transistor is coupled to each dynamic node and has a test enable signal as an input. Each test transistor does not conduct for a normal mode and conducts for a test mode based on the state of the test enable signal. The test transistor, the keeper transistor, and the output inverter of each domino logic circuit forms a write latch for that domino logic circuit in the test mode when the associated test transistor conducts.

The complex circuit of this embodiment also includes a multiplexer that receives the test enable signal, the clock signal, and the wait signal as inputs. The multiplexer enables the normal mode and the test mode for each footer device in each domino logic circuit. For each footer device, the multiplexer also enables selection of a precharge phase for charging the dynamic node, a write phase for generating a value to the write latch in accordance with the logic operating on the dynamic node, and a wait phase for enabling reading the value. The precharge phase, the write phase, and the wait phase are based on states of the test enable signal, the clock signal, and the wait signal.

Those skilled in the art will appreciate that variations from the specific embodiments disclosed above are contemplated by the invention. The invention should not be restricted to the above embodiments, but should be measured by the following claims.

What is claimed is:
1. A domino logic circuit comprising:
a dynamic node;
an output inverter for inverting an output of the dynamic node;
a precharge transistor for charging the dynamic node;

a logic network coupled to the dynamic node for discharging the dynamic node in accordance with logic;

a footer transistor for enabling and disabling the logic network;

a keeper transistor coupled to the dynamic node for retaining a charge state of the dynamic node while awaiting the logic network to operate in accordance with the logic;

a test transistor coupled to the dynamic node and having a test enable signal as an input and configured to not conduct for a normal mode and to conduct for a test mode based on the test enable signal, wherein the test transistor, the keeper transistor, and the output inverter form a write latch in the test mode when the test transistor conducts; and a multiplexer having the test enable signal, a clock signal, and a wait signal as other inputs and configured to:

enable the normal mode and the test mode for the footer transistor;

enable a precharge phase for the normal mode in which the precharge transistor charges the dynamic node and an evaluation phase for the normal mode in which the logic network operates on the dynamic node, the precharge phase and the evaluation phase determined by states of the test enable signal and the clock signal; and enable selection of another precharge phase for the test mode in which the precharge transistor charges the dynamic node, a write phase for the test mode in which the logic network operates on the dynamic node to cause a value to be written to the write latch based on the logic, and a wait phase for the test mode for which the write latch can be read to determine if the value transitions thereby indicating a fault, the other precharge phase, the write phase, and the wait phase determined by other states of the test enable signal, the clock signal, and the wait signal.

2. The circuit of claim 1 wherein a test frequency of the circuit is below an operating frequency of the circuit.

3. The circuit of claim 2 wherein the test frequency is approximately between 40 and 50 MHz.

4. The circuit of claim 1 wherein the test transistor is weaker than the keeper transistor.

5. The circuit of claim 4 wherein a $W/L_{keeper}$ of the keeper transistor is approximately 8-10 times a $W/L_{test}$ of the test transistor.

6. The circuit of claim 1 wherein the test transistor comprises an NMOS transistor.

7. The circuit of claim 1 wherein the value at an end of the wait phase indicates at least one fault selected from a group consisting of a keeper fault and a footer fault.

8. The circuit of claim 1 wherein the value at a beginning of the wait phase is a first logic state and the value at an end of the wait phase is a second logic state.

9. A domino logic circuit comprising:

a dynamic node;

a precharge device for charging the dynamic node;

an output inverter for inverting an output of the dynamic node;

a logic network coupled to the dynamic node for discharging the dynamic node in accordance with logic;

a footer device for enabling and disabling the logic network;

a keeper device coupled to the dynamic node for retaining a charge state of the dynamic node while awaiting the logic network to operate in accordance with the logic;

a test mode selection device coupled to the keeper device at the dynamic node and configured to enable a latch in the test mode; and a phase selection device configured to receive at least a wait signal and to enable selection of at least a precharge phase for charging the dynamic node to a voltage level, a write phase for generating a value to the latch based on the logic and the voltage level of the dynamic node, and a wait phase for enabling reading the value, wherein the selection is based, at least partially, on the wait signal state.

10. The circuit of claim 9 wherein the phase selection device comprises a multiplexer configured to receive a test enable signal, a clock signal, and the wait signal, to enable the normal mode and the test mode for the footer device, to enable selection of another precharge phase and an evaluation phase for the normal mode based on the test enable signal and the clock signal, and to enable selection of the precharge phase, the write phase, and the wait phase for the test mode based on the test enable signal, the clock signal, and the wait signal.

11. The circuit of claim 9 wherein:

the phase selection device comprises a transistor coupled to the footer device and the dynamic node and configured to receive the wait signal and to conduct and enable the logic network or not conduct and disable the logic network based on the wait signal; and the footer device is configured to receive a clock signal and to enable and disable the logic network based on the clock signal.

12. The circuit of claim 9 wherein the test mode selection device comprises a transistor configured to receive a test enable signal and to enable the latch for the test mode when the test enable signal is a logic 1.

13. A domino logic circuit comprising:

a precharge device for charging a dynamic node;

an output inverter for inverting an output of the dynamic node;

a logic network coupled to the dynamic node for discharging the dynamic node in accordance with logic;

a footer device for enabling and disabling the logic network;

a keeper device coupled to the dynamic node for retaining a charge state of the dynamic node;

a test mode selection device coupled to the dynamic node and configured to receive a test enable signal and to enable a test mode to determine whether at least one fault is present for at least the keeper device; and a phase selection device configured to receive at least a wait signal and, based on a state of the wait signal and another state of the test enable signal, to enable selection of at least a precharge phase for charging the dynamic node to a voltage level, a write phase for generating a value from the dynamic node based on the logic, and a wait phase for enabling reading the value to determine if the value transitions.

14. The circuit of claim 13 wherein the phase selection device further is configured to receive the test enable signal and the clock signal for testing the keeper device and the footer device and to enable selection of at least the precharge phase, the write phase, and the wait phase for the test mode by propagating states of the wait signal, the test enable signal, and the clock signal.

15. The circuit of claim 14 wherein the value at an end of the wait phase indicates the at least one fault, and the at least one fault is selected from a group consisting of a keeper fault and a footer fault.

16. The circuit of claim 13 wherein the value at a beginning of the wait phase is a first logic state and the value at an end of the wait phase is a second logic state.

17. A complex circuit comprising:
a plurality of domino logic circuits, each comprising:
a dynamic node;
an output inverter for inverting an output of the dynamic node;
a precharge transistor for charging the dynamic node;
a logic network coupled to the dynamic node for discharging the dynamic node in accordance with logic;
a footer transistor for enabling and disabling the logic network;
a keeper transistor coupled to the dynamic node for retaining a charge state of the dynamic node while awaiting the logic network to operate in accordance with the logic state; and
a test transistor coupled the dynamic node and having a test enable signal as an input and configured to not conduct for a normal mode and to conduct for a test mode based on the test enable signal, wherein the test transistor, the keeper transistor, and the output inverter form a write latch in the test mode when the test transistor conducts; and
a multiplexer configured to receive the test enable signal, a clock signal, and a wait signal and, for the footer transistor of each domino logic circuit, to enable the normal mode and the test mode, and, for the test mode, to enable selection of a precharge phase for charging the dynamic node, a write phase for generating a value to the write latch in accordance with the logic operating on the dynamic node, and a wait phase for enabling reading the value, the precharge phase, the write phase, and the wait phase based on the test enable signal, the clock signal, and a wait signal.

18. The circuit of claim 17 further comprising a delay element between each domino logic circuit configured to delay the wait signal.

19. The circuit of claim 17 further comprising a delay element between each domino logic circuit configured to delay the clock signal.

20. The circuit of claim 17 wherein the complex circuit comprises a ripple carry adder.

21. The circuit of claim 20 wherein the ripple carry adder comprises a plurality of CMOS full adders, and each CMOS full adder comprises a sum domino circuit and a carry domino circuit.

22. The circuit of claim 21 further comprising a logic gate configured to receive a sum output of each sum domino circuit and a carry output of each carry domino circuit and to generate at least one sum fault analysis signal and at least one carry fault analysis signal.

23. The circuit of claim 17 further comprising a fault analysis element configured to receive a fault output of each domino circuit at an end of the wait phase and to generate at least one fault analysis signal indicating whether a fault is present.

24. The circuit of claim 23 wherein the at least one fault analysis signal indicates the presence of at least one fault selected from a group consisting of a keeper fault and a footer fault.

25. The circuit of claim 23 wherein the at least one fault analysis signal indicates the presence of at least one fault selected from a group consisting of a keeper source stuck-at-0 fault, a keeper gate floating fault, a keeper source floating fault, a keeper drain floating fault, a keeper stuck-on fault, a keeper stuck-open fault, a footer drain stuck-at-0 fault, a footer gate stuck-at-1 fault, a footer stuck-on fault, and a footer drain-source bridge (hard short) fault.

26. The circuit of claim 17 wherein the value at an end of the wait phase indicates at least one fault selected from a group consisting of a keeper fault and a footer fault.

27. The circuit of claim 17 wherein the value at a beginning of the wait phase is a first logic state and the value at an end of the wait phase is a second logic state.

28. A method for determining if at least one fault is present in a domino logic circuit comprising a dynamic node, an output inverter for inverting an output of the dynamic node, a precharge transistor for charging the dynamic node, a logic network coupled to the dynamic node for discharging the dynamic node in accordance with logic, a footer transistor for enabling and disabling the logic network, and a keeper transistor coupled to the dynamic node for retaining a charge state of the dynamic node while awaiting the logic network to operate in accordance with the logic, the method comprising:
coupling a test transistor to the dynamic node;
configuring the test transistor with a test enable signal as an input;
configuring the test transistor to not conduct for a normal mode and to conduct for a test mode based on the test enable signal, and configuring the test transistor, the keeper transistor, and the output inverter to form a write latch in the test mode when the test transistor conducts; and
coupling a multiplexer to the footer transistor;
configuring the multiplexer with the test enable signal, a clock signal, and a wait signal as other inputs;
configuring the multiplexer to enable the normal mode and the test mode for the footer transistor;
configuring the multiplexer to enable a precharge phase for the normal mode in which the precharge transistor charges the dynamic node and an evaluation phase for the normal mode in which the logic network operates on the dynamic node, the precharge phase and the evaluation phase determined by states of the test enable signal and the clock signal; and
configuring the multiplexer to enable selection of another precharge phase for the test mode in which the precharge transistor charges the dynamic node, a write phase for the test mode in which the logic network operates on the dynamic node to cause a value to be written to the write latch based on the logic, and a wait phase for the test mode for which the write latch can be read to determine if the value transitions thereby indicating the at least one fault, wherein the other precharge phase, the write phase, and the wait phase are determined by other states of the test enable signal, the clock signal, and the wait signal.

29. The method of claim 28 further comprising testing the circuit at a test frequency that is below an operating frequency of the circuit.

30. The method of claim 29 further comprising testing the circuit at approximately between 40 and 50 MHz.

31. The method of claim 28 further comprising configuring the test transistor as weaker than the keeper transistor.

32. The method of claim 31 further comprising configuring a $W/L_{keeper}$ of the keeper transistor as approximately 8-10 times a $W/L_{test}$ of the test transistor.

33. The method of claim 28 further comprising configuring the test transistor comprising an NMOS transistor.

34. The method of claim 28 further comprising reading the value at an end of the wait phase, wherein the value indicates at least one fault selected from a group consisting of a keeper fault and a footer fault.

35. The method of claim 28 further comprising reading the value at an end of the wait phase, wherein the value at a beginning of the wait phase is a first logic state and the value at an end of the wait phase is a second logic state.

36. A method for testing a domino logic circuit comprising a dynamic node, a precharge device for charging the dynamic node, a logic network coupled to the dynamic node for discharging the dynamic node in accordance with logic, a footer device for enabling and disabling the logic network, and a keeper device coupled to the dynamic node for retaining a charge state of the dynamic node while awaiting the logic network to operate in accordance with the logic, the method comprising:
   coupling a test mode selection device to the keeper device at the dynamic node;
   enabling a latch in the test mode using the test mode selection device; and
   receiving at least a wait signal at a phase selection device and, based at least partially on a state of the wait signal, enabling selection of at least a precharge phase for charging the dynamic node to a voltage level, a write phase for generating a value to the latch based on the logic and the voltage level of the dynamic node, and a wait phase for enabling reading the value.

37. The method of claim 36 wherein the phase selection device comprises a multiplexer, and the method further comprises:
   receiving a test enable signal, a clock signal, and the wait signal at the multiplexer;
   enabling, at the multiplexer, the normal mode and the test mode for the footer device;
   enabling selection of another precharge phase and an evaluation phase for the normal mode based on the test enable signal and the clock signal; and
   enabling selection of the precharge phase, the write phase, and the wait phase for the test mode based on the test enable signal, the clock signal, and the wait signal.

38. The method of claim 36 wherein the phase selection device comprises a transistor, and the method further comprises:
   coupling the transistor to the footer device and the dynamic node;
   configuring the transistor to receive the wait signal and to conduct and enable the logic network or not conduct and disable the logic network based on the wait signal; and
   configuring the footer device to receive a clock signal and to enable and disable the logic network based on the clock signal.

39. The method of claim 36 wherein the test mode selection device comprises a transistor and the method further comprises configuring the transistor to receive a test enable signal and to enable the latch for the test mode when the test enable signal is a logic 1.

40. A method for testing a domino logic circuit comprising:
   configuring a precharge device for charging a dynamic node;
   configuring an output inverter for inverting an output of the dynamic node;
   coupling a logic network to the dynamic node for discharging the dynamic node in accordance with logic;
   configuring a footer device for enabling and disabling the logic network;
   configuring a keeper device for retaining a charge state of the dynamic node;
   coupling a test mode selection device to the dynamic node and configuring the test mode selection device to receive a test enable signal and to enable a test mode to determine whether at least one fault is present for at least the keeper device; and
   configuring a phase selection device to receive at least a wait signal and, based on a state of the wait signal and another state of the test enable signal, to enable selection of at least a precharge phase for charging the dynamic node to a voltage level, a write phase for generating a value from the dynamic node based on the logic, and a wait phase for enabling reading the value to determine if the value transitions.

41. The method of claim 40 further comprising configuring the phase selection device to receive the test enable signal and the clock signal for testing the keeper device and the footer device and to enable selection of at least the precharge phase, the write phase, and the wait phase for the test mode by propagating states of the wait signal, the test enable signal, and the clock signal.

42. The method of claim 41 further comprising reading the value at an end of the wait phase, wherein the value indicates at least one fault selected from a group consisting of a keeper fault and a footer fault.

43. The method of claim 40 further comprising reading the value at an end of the wait phase, wherein the value at a beginning of the wait phase is a first logic state and the value at an end of the wait phase is a second logic state.

44. A method for determining if at least one fault is present in a complex circuit comprising:
   configuring a plurality of domino logic circuits, each comprising:
      a dynamic node,
      an output inverter for inverting an output of the dynamic node,
      a precharge transistor for charging the dynamic node,
      a logic network coupled to the dynamic node for discharging the dynamic node in accordance with logic,
      a footer transistor for enabling and disabling the logic network, and
      a keeper transistor coupled to the dynamic node for retaining a charge state of the dynamic node while awaiting the logic network to operate in accordance with the logic state; and
   for each domino logic circuit:
      coupling a test transistor to the dynamic node;
      configuring the test transistor for an input comprising a test enable signal; and
      configuring the test transistor to not conduct for a normal mode and to conduct for a test mode based on the test enable signal and forming a write latch with the test transistor, the keeper transistor, and the output inverter in the test mode when the test transistor conducts; and
   configuring a multiplexer to receive the test enable signal, a clock signal, and a wait signal and, for the footer transistor of each domino logic circuit, to enable the normal mode and the test mode, and, for the test mode, to enable selection of a precharge phase for charging the dynamic node, a write phase for generating a value to the write latch in accordance with the logic operating on the dynamic node, and a wait phase for enabling reading the value, wherein the precharge phase, the write phase, and the wait phase is based on the test enable signal, the clock signal, and a wait signal.

45. The method of claim 44 further comprising coupling a delay element between each domino logic circuit for delaying the wait signal.

46. The method of claim 44 further comprising coupling a delay element between each domino logic circuit configured for delaying the clock signal.

47. The method of claim 44 wherein the complex circuit comprises a ripple carry adder, and the method further comprises determining if the at least one fault is present in the ripple carry adder.

48. The method of claim 47 wherein the ripple carry adder comprises a plurality of CMOS full adders, and each CMOS full adder comprises a sum domino circuit and a carry domino circuit, and the method further comprises determining if the at least one fault is present in the sum domino circuit and the carry domino circuit.

49. The method of claim 48 further comprising receiving a sum output of each sum domino circuit and a carry output of each carry domino circuit at a logic gate and generating at least one sum fault analysis signal and at least one carry fault analysis signal.

50. The method of claim 44 further comprising receiving a fault output of each domino circuit at a fault analysis element at an end of the wait phase and generating at least one fault analysis signal indicating whether a fault is present.

51. The method of claim 50 further comprising indicating at least one fault with the at least one fault analysis signal, the at least one fault selected from a group consisting of a keeper fault and a footer fault.

52. The method of claim 50 further comprising indicating at least one fault with the at least one fault analysis signal, the at least one fault selected from a group consisting of a keeper source stuck-at-0 fault, a keeper gate floating fault, a keeper source floating fault, a keeper drain floating fault, a keeper stuck-on fault, a keeper stuck-open fault, a footer drain stuck-at-0 fault, a footer gate stuck-at-1 fault, a footer stuck-on fault, and a footer drain-source bridge (hard short) fault.

53. The method of claim 44 further comprising reading the value at an end of the wait phase, wherein the value indicates at least one fault selected from a group consisting of a keeper fault and a footer fault.

54. The method of claim 44 further comprising reading the value at an end of the wait phase, wherein the value at a beginning of the wait phase is a first logic state and the value at an end of the wait phase is a second logic state.

* * * * *